(12) United States Patent
Xu et al.

(10) Patent No.: US 11,482,471 B2
(45) Date of Patent: Oct. 25, 2022

(54) THERMAL MANAGEMENT SOLUTIONS FOR INTEGRATED CIRCUIT PACKAGES

(71) Applicant: Intel Corporation, Santa Clara, CA (US)

(72) Inventors: Cheng Xu, Chandler, AZ (US); Junnan Zhao, Gilbert, AZ (US); Zhimin Wan, Chandler, AZ (US); Ying Wang, Chandler, AZ (US); Yikang Deng, Chandler, AZ (US); Chong Zhang, Chandler, AZ (US); Jiwei Sun, Chandler, AZ (US); Zhenguo Jiang, Chandler, AZ (US); Kyu-Oh Lee, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 728 days.

(21) Appl. No.: 16/287,728

(22) Filed: Feb. 27, 2019

(65) Prior Publication Data

US 2020/0273776 A1    Aug. 27, 2020

(51) Int. Cl.
*H01L 23/46* (2006.01)
*H01L 23/467* (2006.01)
(Continued)

(52) U.S. Cl.
CPC .......... *H01L 23/46* (2013.01); *H01L 23/3157* (2013.01); *H01L 23/467* (2013.01);
(Continued)

(58) Field of Classification Search
CPC . H01L 23/467; H01L 23/3157; H01L 23/473; H01L 23/66; H01L 2223/6677; H01L 23/12; H01L 23/13; H01L 23/46; H01L 23/481; H01L 23/488; H01L 23/49816; H01L 23/498; H01L 23/49822; H01L 23/49827; H01L 23/49833; H01L 23/5384; H01L 23/5385; H05K 1/0204;
(Continued)

(56) References Cited

U.S. PATENT DOCUMENTS

| 8,563,365 B2 * | 10/2013 | King, Jr | .................. H01L 23/48 |
| | | | 257/713 |
| 10,262,920 B1 * | 4/2019 | Refai-Ahmed | ..... H01L 23/4275 |

(Continued)

*Primary Examiner* — Eduardo A Rodela
(74) *Attorney, Agent, or Firm* — Essential Patents Group, LLP.

(57) ABSTRACT

An integrated circuit package may be formed having a heat transfer fluid chamber, wherein the heat transfer fluid chamber may be positioned to allow a heat transfer fluid to directly contact an integrated circuit device within the integrated circuit package. In one embodiment, a first surface of the integrated circuit device may be electrically attached to a first substrate. The first substrate may then may be electrically attached to a second substrate, such that the integrated circuit device is between the first substrate and the second substrate. The second substrate may include a cavity, wherein the heat transfer fluid chamber may be formed between a second surface of the integrated circuit device and the cavity of the second substrate. Thus, at least a portion of a second surface of the integrated circuit device is exposed to the heat transfer fluid which flows into the heat transfer fluid chamber.

18 Claims, 7 Drawing Sheets

(51) Int. Cl.
*H05K 1/18* (2006.01)
*H05K 1/02* (2006.01)
*H05K 3/32* (2006.01)
*H01L 23/473* (2006.01)
*H01L 23/66* (2006.01)
*H01L 23/31* (2006.01)

(52) U.S. Cl.
CPC ............ *H01L 23/473* (2013.01); *H01L 23/66* (2013.01); *H05K 1/0204* (2013.01); *H05K 1/181* (2013.01); *H05K 3/32* (2013.01); *H01L 2223/6677* (2013.01); *H05K 2201/064* (2013.01); *H05K 2201/10378* (2013.01); *H05K 2201/10734* (2013.01)

(58) Field of Classification Search
CPC .... H05K 1/181; H05K 3/32; H05K 2201/064; H05K 2201/10378; H05K 2201/10734
See application file for complete search history.

(56) References Cited

U.S. PATENT DOCUMENTS

| | | | |
|---|---|---|---|
| 2009/0057881 A1* | 3/2009 | Arana | H01L 25/0657 257/E21.511 |
| 2010/0171213 A1* | 7/2010 | Hisano | H01L 23/473 257/E23.098 |
| 2010/0187683 A1* | 7/2010 | Bakir | H01L 23/53276 257/713 |
| 2012/0261177 A1* | 10/2012 | Yamamoto | H01L 21/486 174/262 |
| 2013/0223010 A1* | 8/2013 | Shioga | H01L 23/427 438/122 |
| 2017/0179001 A1* | 6/2017 | Brunschwiler | H01L 23/427 |
| 2020/0176357 A1* | 6/2020 | Yu | H01L 23/367 |
| 2020/0203256 A1* | 6/2020 | Neal | H01L 23/49827 |
| 2020/0211927 A1* | 7/2020 | Wan | H01L 21/4882 |
| 2020/0273775 A1* | 8/2020 | Karhade | H01L 23/13 |

* cited by examiner

THERMAL MANAGEMENT SOLUTIONS FOR INTEGRATED CIRCUIT PACKAGES

TECHNICAL FIELD

Embodiments of the present description generally relate to the removal of heat from integrated circuit devices, and, more particularly, to thermal management solutions wherein an integrated circuit package is configured to allow a heat transfer fluid to physically contact at least one integrated circuit device within the integrated circuit device package.

BACKGROUND

Higher performance, lower cost, increased miniaturization, and greater packaging density of integrated circuits within integrated circuit devices are ongoing goals of the electronics industry. As these goals are achieved, the integrated circuit devices become smaller. Accordingly, the density of power consumption of electronic components within the integrated circuit devices has increased, which, in turn, increases the average junction temperature of the integrated circuit device. If the temperature of the integrated circuit device becomes too high, the integrated circuits may be damaged or destroyed. This issue becomes even more critical when multiple components, such as integrated circuit devices and/or substrates, are incorporated in a stacked configuration. As will be understood to those skilled in the art, when multiple components are stacked, some of the integrated circuit devices will be "internally" positioned between at least one adjacent integrated circuit device and/or at least one substrate. As such, these internally positioned integrated circuit devices are isolated from thermal management solutions, such as heat spreaders, since the integrated circuit devices and/or the substrate to which the integrated circuit devices may be adjacent, are generally not efficient thermal conductors, nor are the various intervening layers, such as thermal interface material layers, underfill materials, and the like, which are between the internally positioned integrated circuit device and the thermal management solutions. This may be a particular issue for integrated circuit devices which have hotspots (e.g. areas with concentrated high-power density). Thus, the internally positioned integrated circuit devices may exceed their temperature limits, which may require throttling (speed reduction of the integrated circuit devices) that can lead to reduced performance, or, in extreme cases, can lead to damage and failure of the entire integrated circuit package.

Various thermal solutions have been employed to mitigate these heat dissipation issues, such as heat sinks and heat spreaders. However, these thermal solutions generally cannot be employed due to height restrictions, as will be understood to those skilled in the art. Thus, thermal solutions that do not impact integrated circuit package height, such as thermal vias and plated through-holes, have been used. However, as thermal demands on integrated circuit packages increase, particularly with regard to hotspots, these thermal solutions may be insufficient.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
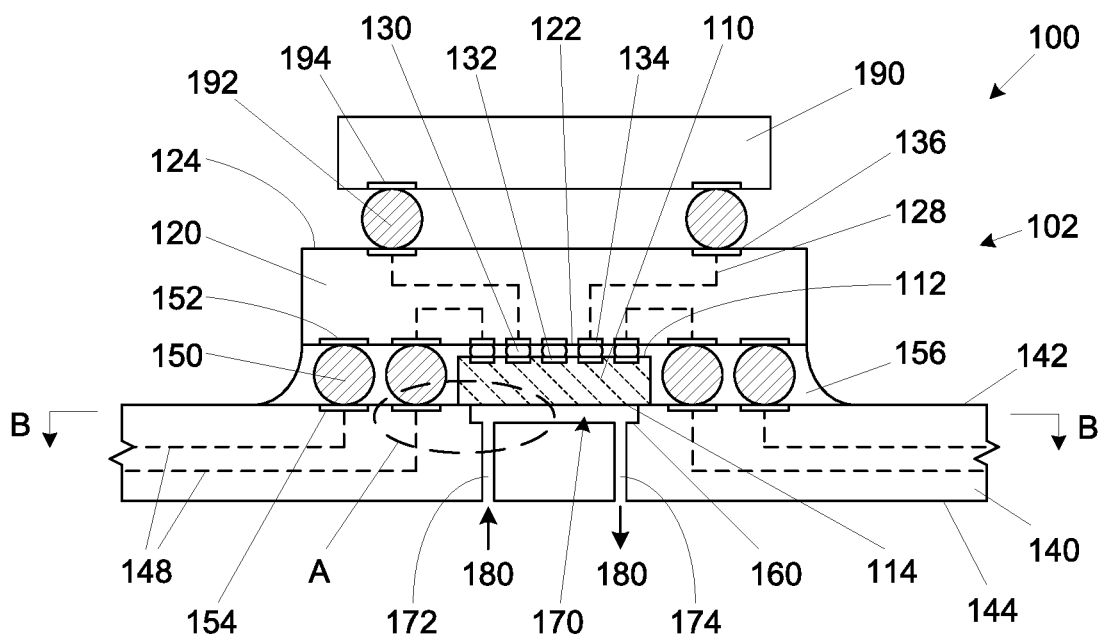
FIG. 1 is a side cross-sectional view of an integrated circuit package, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures. as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more integrated circuit devices by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description include an integrated circuit package that may be formed having a heat transfer fluid chamber therein. The heat transfer fluid chamber may be positioned to allow a heat transfer fluid to come into direct contact with an integrated circuit device within the integrated circuit package. In one embodiment, a first surface of the integrated circuit device may be electrically attached to a first substrate. The first substrate may then be electrically attached to a second substrate, such that the integrated circuit device is between the first substrate and the second substrate. The second substrate may include a cavity, wherein the heat transfer fluid chamber may be formed between a second surface of the integrated circuit device and the cavity of the second substrate. Thus, at least a portion of a second surface of the integrated circuit device is exposed to the heat transfer fluid which flows into the heat transfer fluid chamber. The heat transfer fluid may be introduced into and removed from the heat transfer fluid chamber with an inlet port and an outlet port, respectively, extending through the second substrate.

As shown in FIG. 1, an integrated circuit assembly 100 may comprise at least one integrated circuit device 110, having a first surface 112 and an opposing second surface 114, electrically attached to a first surface 122 of a first substrate 120, such as an interposer. The integrated circuit device 110 may be electrically attached to the first substrate 120 through a plurality of device-to-substrate interconnects 130. The plurality of device-to-substrate interconnects 130 may extend from bond pads 132 on the first surface 112 of the integrated circuit device 110 and device-to-substrate bond pads 134 on the first surface 122 of the first substrate 120. The bond pads 132 of the integrated circuit device 110 may be in electrical communication with circuitry (not shown) within the integrated circuit device 110. The combination of the at least one integrated circuit device 110 and the first substrate 120 may form an integrated circuit package 102.

The integrated circuit package 100 may further include a second substrate 140, such as a board or motherboard, having a first surface 142 and an opposing second surface 144, wherein the first surface 122 of the first substrate 120 may be electrically attached to the first surface 142 of the second substrate 140. The first substrate 120 may be electrically attached to the second substrate 140 through a plurality of substrate-to-substrate interconnects 150. The plurality of substrate-to-substrate interconnects 150 may extend from substrate-to-substrate bond pads 152 on the first surface 122 of the first substrate 120 and bond pads 154 on the first surface 142 of the second substrate 140. In one embodiment, the pitch of the device-to-substrate bond pads 134 of the first substrate 120 may be smaller than the pitch of the substrate-to-substrate bond pads 152 of the first substrate 120, as will be understood to those skilled in the art.

In one embodiment, the integrated circuit package 100 may include an additional integrated circuit device 190 electrically attached to a second surface 124 of the first substrate 120 through a plurality of additional device-to-substrate interconnects 192. The plurality of additional device-to-substrate interconnects 192 may extend from bond pads 194 on the additional integrated circuit device 190 and bond pads 136 on the second surface 124 of the first substrate 120. The bond pads 194 of the additional integrated circuit device 190 may be in electrical communication with circuitry (not shown) within the additional integrated circuit device 190.

The device-to-substrate interconnects 130, the substrate-to-substrate interconnects 150, and the additional device-to-substrate interconnects 192 can be made of any appropriate material, including, but not limited to, solder materials. The solder materials may be any appropriate material, including, but not limited to, lead/tin alloys, such as 63% tin/37% lead solder, and high tin content alloys (e.g. 90% or more tin), such as tin/bismuth, eutectic tin/silver, ternary tin/silver/copper, eutectic tin/copper, and similar alloys. When the integrated circuit device 110 is attached to the first substrate 120 with device-to-substrate interconnects 130 that are made of solder, when the first substrate 120 is attached to the second substrate 140 with device-to-substrate interconnects 150 that are made of solder, and/or wherein the additional integrated circuit device 190 is attached to the first substrate 120 with additional device-to-substrate interconnects 192 that are made of solder, the solder is reflowed, either by heat, pressure, and/or sonic energy to secure the solder therebetween.

The integrated circuit device 110 and the additional integrated circuit device 190 may be any appropriate device, including but not limited to, a microprocessor, a chipset, a graphics device, a radio frequency and wireless integrated circuit device, an antenna patch device, a memory device, an application specific integrated circuits, combinations thereof, stacks thereof, or the like. In a specific embodiment, the integrated circuit device 110 is a radio frequency device designed to send and/or receive signals or data from antennas or from other system devices and the additional circuit device 190 is an antenna patch device.

The first substrate 120 may include at least one conductive route (shown as dashed lines 128), also known as metallization, extending therethrough or thereon to form electrical connections between the device-to-substrate bond pads 134 and the substrate-to-substrate bond pads 152. The conductive routes 128 may also form electrical connections between the device-to-substrate bond pads 134 and bond pads 136 on or in the second surface 124 of the first substrate 120. The second substrate 140 may also include at least one conductive route (shown as dashed lines 148) extending therethrough or thereon to form electrical connections between the bond pads 154 of the second substrate 140 and external components (not shown).

The first substrate 120 and the second substrate 140 may be primarily composed of an appropriate dielectric material, including, but not limited to, bismaleimide triazine (BT) resin, fire retardant grade 4 (FR-4) material, polyimide materials, glass reinforced epoxy matrix material, low-k and ultra low-k dielectrics (e.g. carbon-doped dielectrics, fluorine-doped dielectrics, porous dielectrics, and organic polymeric dielectric), and the like, as well as laminates or multiple layers thereof. The substrate conductive routes 140, also known as metallization, may be composed of any conductive material, including but not limited to metals, such as copper, silver, gold, nickel, and aluminum, and alloys thereof. As will be understood to those skilled in the art, the conductive routes 128 for the first substrate 120 and the conductive routes 148 of the second substrate 140 may be formed as a plurality of conductive traces (not shown in FIG. 1) formed on layers of dielectric material (not shown in FIG. 1), which are electrically connected by conductive vias (not shown in FIG. 1). Furthermore, the first substrate 120 and/or the second substrate 140 may be either a cored or a coreless substrate. Moreover, the first substrate 120 and/or the second substrate 140 may include additional active or passive integrated circuit device (not shown) formed therein, as will be understood to those skilled in the art. The processes for the fabrication of substrates, such as the first substrate 120 and the second substrate 140, are well known in the art and for purposes of brevity and conciseness will not be described herein.

As further shown in FIG. 1, a cavity 160 may be formed to extend into the second substrate 140 from the first surface 142 thereof. The cavity 160 may be formed in a position such that, when the first substrate 120 is attached to the second substrate 140, the first surface 142 of the second substrate 140 may contact the second surface 114 of the integrated circuit device 110 and form a heat transfer fluid chamber 170 as a combination of the cavity 160 in the second substrate 140 and the second surface 114 of the integrated circuit device 110.

The second substrate 140 may further include at least one inlet port 172 extending from the second surface 144 of the second substrate 140 to the heat transfer fluid chamber 170. The second substrate 140 may also include at least one outlet port 174 extending from the heat transfer fluid chamber 170 to the second surface 144 of the second substrate 140. A heat transfer fluid 180 (illustrated generically as an up arrow (left side) and a down arrow (right side)), which may be used to remove heat from the at least one integrated circuit device 110, may flow into the heat transfer fluid chamber 170 through the at least one inlet port 172 and out of the heat transfer fluid chamber 170 through the at least one outlet port 174. It is understood that some of the materials used to form the second substrate 140 (such as the dielectric material layers) may be porous and adversely affected by contact with the heat transfer fluid 180, and thus a liner layer (not shown) may be used to protect the second substrate 140. The heat transfer fluid 180 may be any appropriate gas or liquid, or a combination thereof. In one embodiment, the heat transfer fluid 180 may comprise water. In another embodiment, the heat transfer fluid 180 may comprise a dielectric refrigerant. In a further embodiment, the heat transfer fluid 180 may comprise an oil. In other embodiments, the heat transfer fluid 180 may be comprised of two phases (such as liquid water and water vapor, or liquid-phase and gas-phase dielectric refrigerant) that exist simultaneously in one or more regions of the heat transfer fluid chamber 170.

Figure 2:
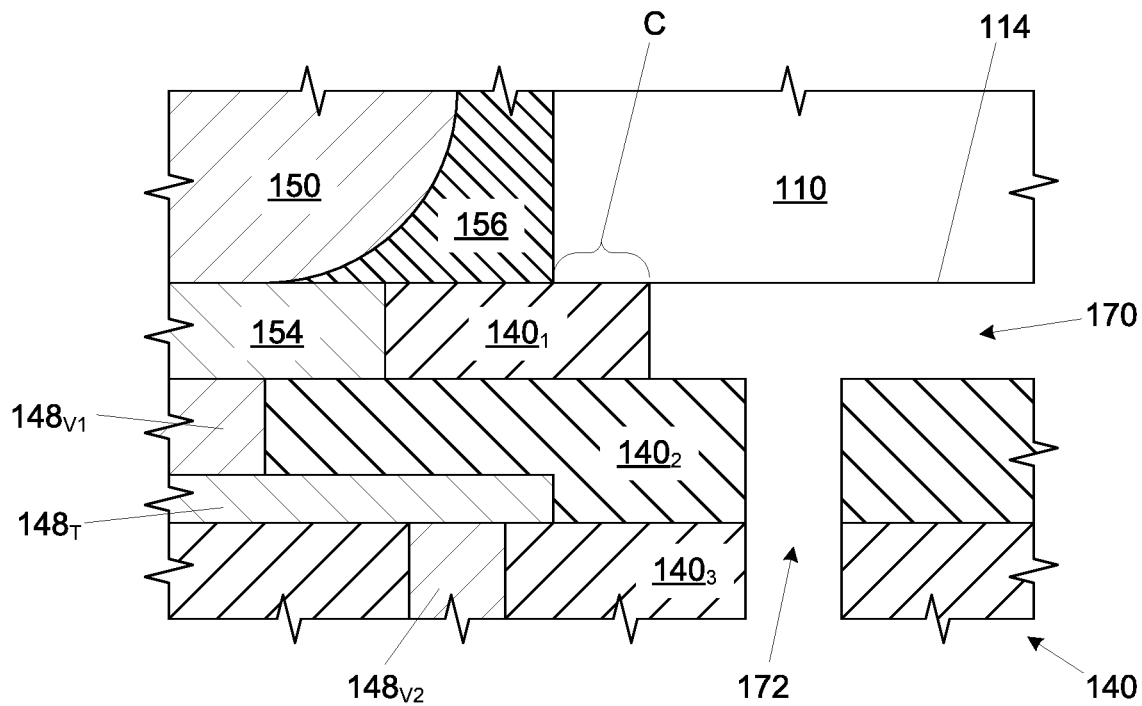
FIG. 2 is a side cross-sectional view of an inset A of FIG. 1, according to one embodiment of the present description.

As shown in FIG. 2, the second substrate 140 may include at least one dielectric layer (shown as first dielectric layer $140_1$, second dielectric layer $140_2$, and third dielectric layer $140_3$), wherein the bond pad 154 of the second substrate 140 is formed in the first dielectric layer $140_1$. The least one conductive route 148 (shown in FIG. 1) may include a first conductive via $148_{V1}$ electrically contacting the bond pad 154 of the second substrate 140 to a conductive trace $148_T$, and a second conductive via $148_{V2}$ electrically contacting the conductive trace $148_T$. The second surface 114 for the integrated circuit device 110 may contact the first dielectric layer $140_1$ and form a contact area C therebetween. As shown in FIG. 2, the heat transfer fluid chamber 170 may be formed by removing a portion of the first dielectric layer $140_1$ or otherwise patterning the first dielectric layer $140_1$. In one embodiment, the first dielectric layer $140_1$ may comprise a solder resist material.

As shown in FIG. 1, an underfill material 156, such as an epoxy material, may be disposed between the first surface 122 of the first substrate 120 and the second substrate 140 and surround the substrate-to-substrate interconnects 150. The underfill material 156 may further extend between the first surface 122 of the first surface 120 and the first surface 112 of the integrated circuit device 110 and surround the device-to-substrate interconnects 130. The underfill material 156 may provide structural integrity and may prevent contamination, as will be understood to those skilled in the art. Furthermore, as shown in FIG. 2, the underfill material 156 may serve a sealant for the heat transfer fluid chamber 170 if any gaps exist in the contact area C.

Figure 3:
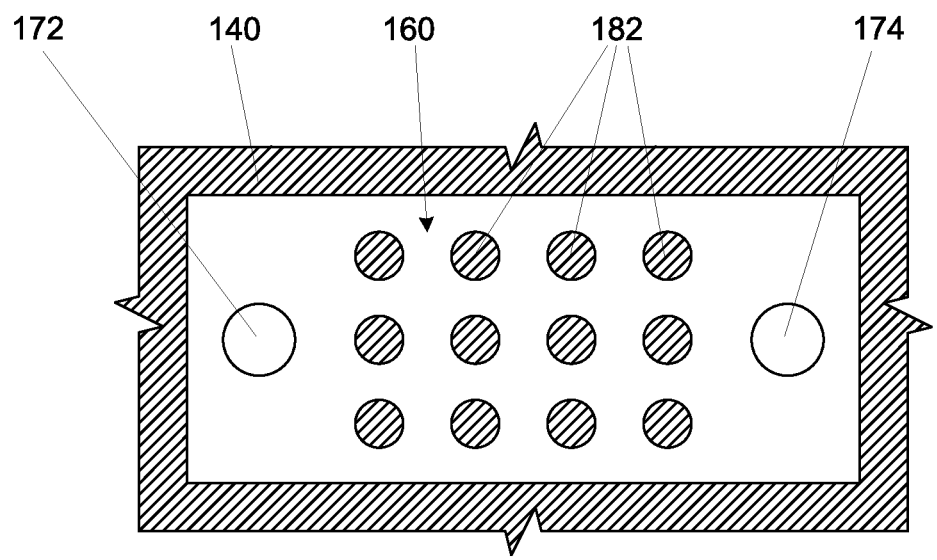
FIGS. 3-5 are plan views of exemplary arrangements of conduits within a fluid chamber along line B-B of FIG. 1, according to various embodiments of the present description.
Figure 4:
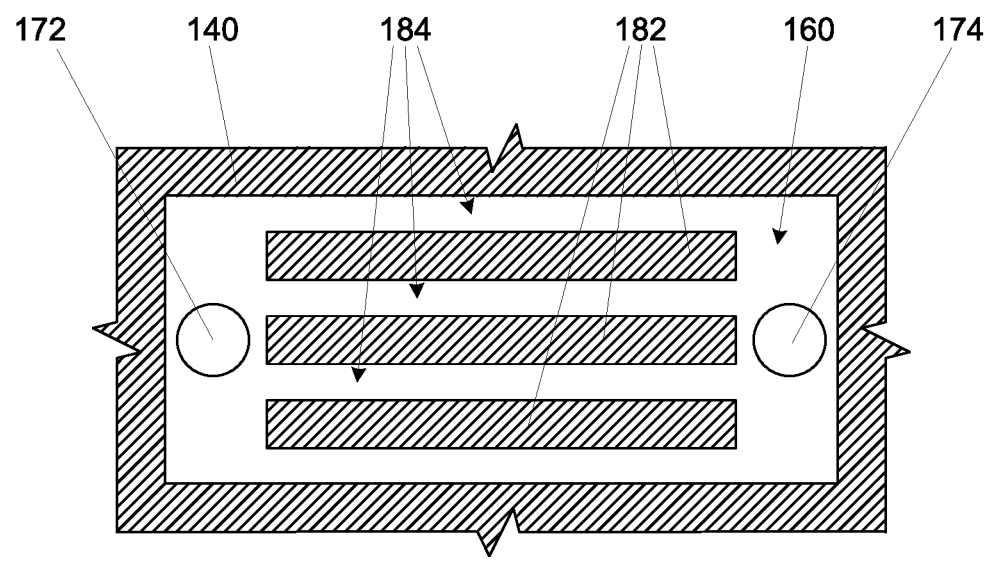
Figure 5:
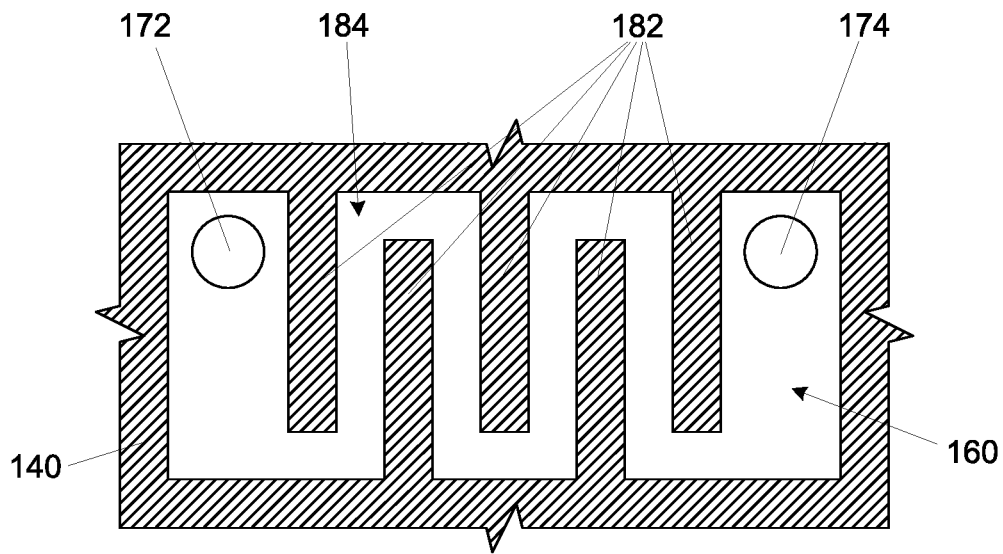

The cavity 160 may have any appropriate configuration. In one embodiment shown in FIG. 3, which is a view along line B-B of FIG. 1, the cavity 160 may be a single structure. In a further embodiment, as also shown in FIG. 3, the cavity 160 may include support structures 182, such as the illustrated columnar structures, disposed therein. In another embodiment shown in FIG. 4, the support structures 182 may be wall-shaped structures that are aligned in parallel, such that a plurality of discrete channels 184 are formed. In a further embodiment, the support structures 182 may be wall-shaped structures that are aligned to form a single circuitous channel 184 traveling a serpentine route from the inlet port 172 to the outlet port 174, as shown in FIG. 5. As will be understood, the support structures 182 may direct the flow of the heat transfer fluid 180 (see FIG. 1) and/or prevent the collapse of the heat transfer fluid chamber 170 (see FIG. 1) from thermal expansion and contraction during the operation of the integrated circuit package 100 (see FIG. 1).

Figure 6:
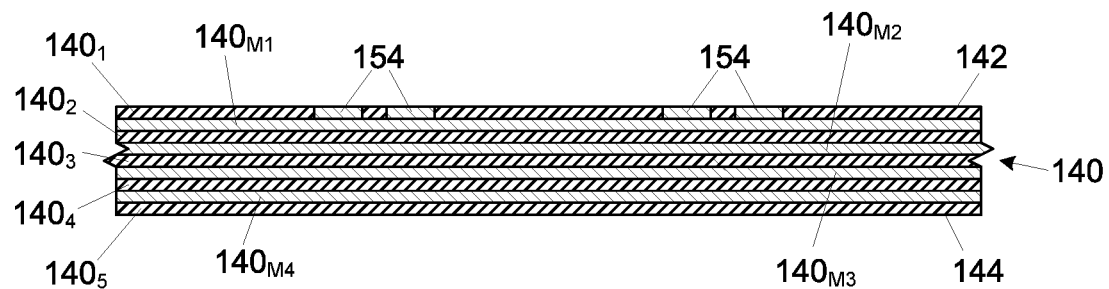
FIGS. 6-10 are a side cross-sectional views of a method of fabricating an integrated circuit package, according to an embodiment of the present description.
Figure 7:
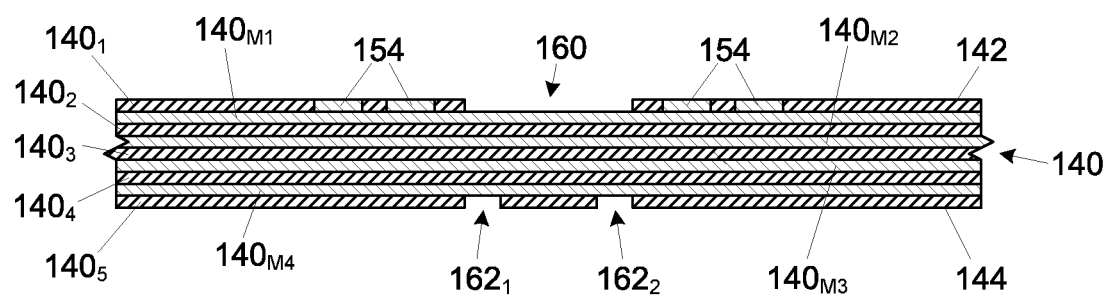
Figure 8:
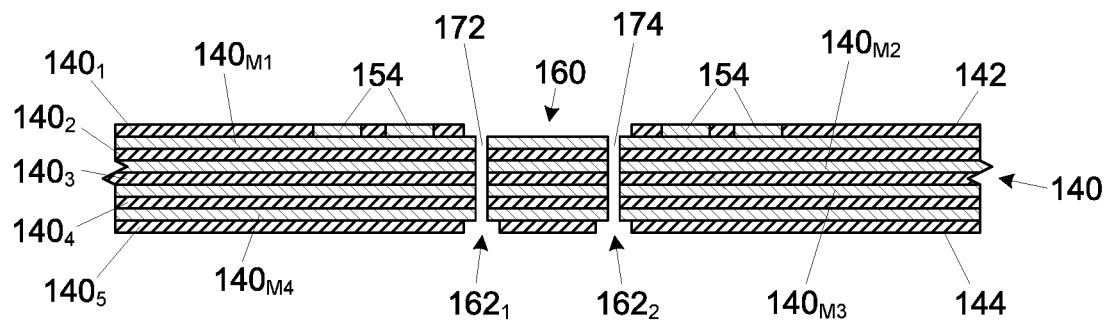
Figure 9:
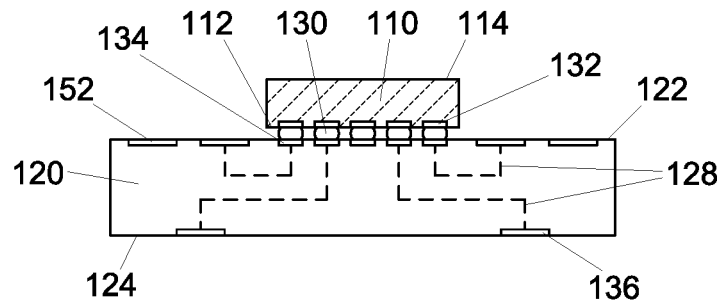
Figure 10:
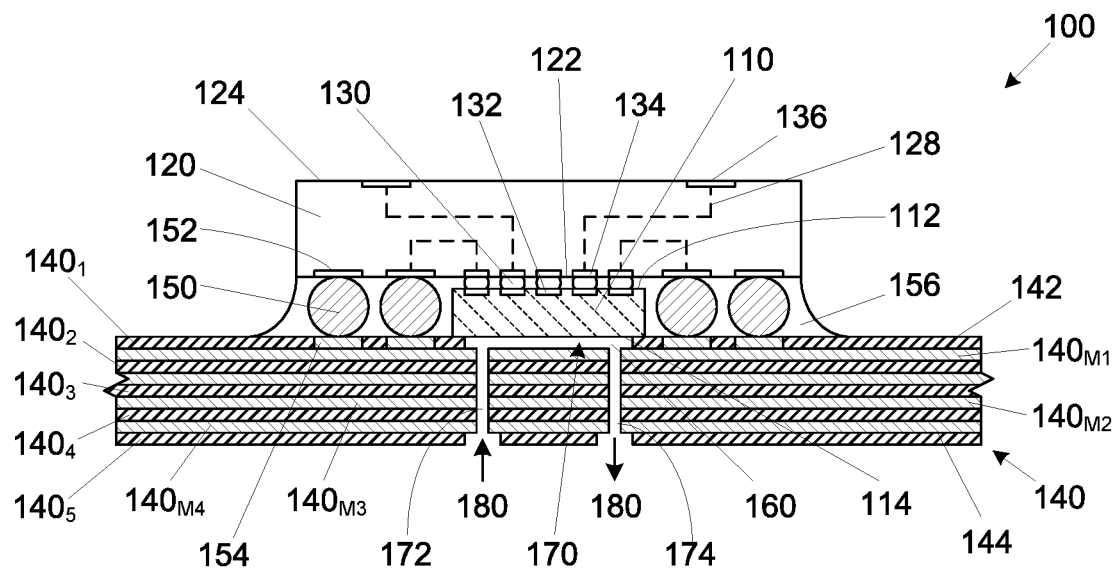

FIGS. 6-10 illustrate a method of fabricating an integrated circuit package, according to one embodiment of the present description. As shown in FIG. 6, the second substrate 140 may be formed comprising a plurality of alternating dielectric layers $140_1$-$140_5$ and metallization layers $140_{M1}$-$140_{M4}$. For the sake clarity, the metallization layers $140_{M1}$-$140_{M4}$ are shown as individual contiguous layers, but are actually discrete conductive traces and conductive vias, as previously discussed. As shown in FIG. 7, a cavity 160 may be formed in the dielectric layers $140_1$ and a pair of openings $162_1$ and $162_2$ may be formed in the opposing dielectric layer $140_5$. In one embodiment, the dielectric layer $140_1$ and $140_5$ may be solder resist layers and the cavity 160 and the pair of openings $162_1$ and $162_2$ may be formed with a "solder resist opening process", as will be understood to those skilled in the art. As shown in FIG. 8, the inlet port 172 and the outlet port 174 may be formed through the second substrate 140, as previously discussed, by any known process, including, but not limited to mechanical drilling, laser drilling, etching, and the like. In one embodiment, the inlet port 172 and the outlet port 174 may be formed with a mechanical through-hole drilling process, as known in the art. As shown in FIG. 9, the integrated circuit device 110 may be attached to the first substrate 120, as previously discussed. The first substrate 120 may be attached to the second substrate 140 and an underfill material 156 may be dispensed between the first substrate 120 and the second substrate, as shown in FIG. 10 and as previously discussed.

Figure 11:
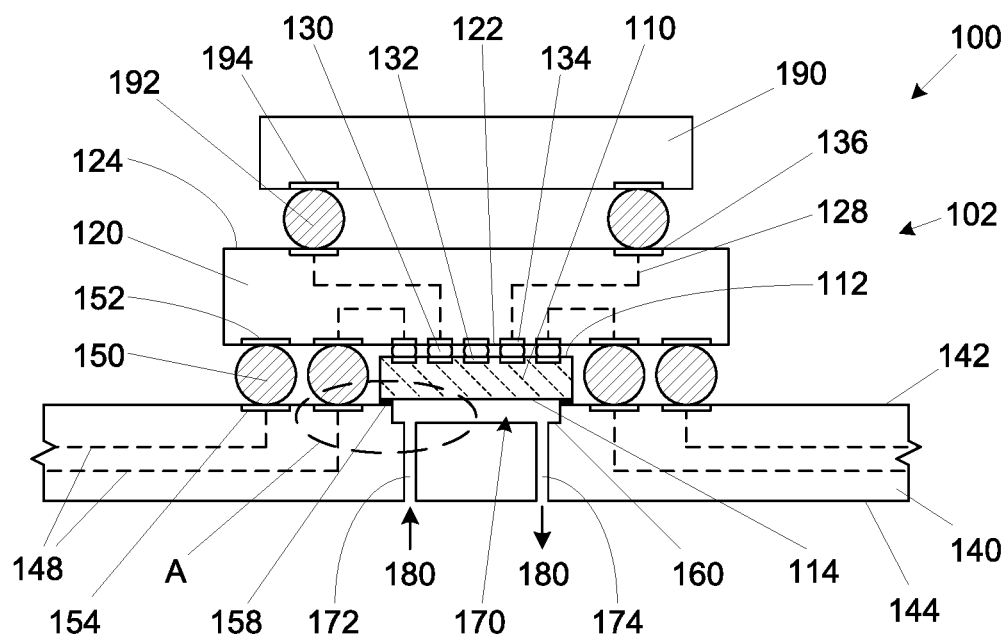
FIG. 11 is a side cross-sectional view of an integrated circuit package, according to another embodiment of the present description.
Figure 12:
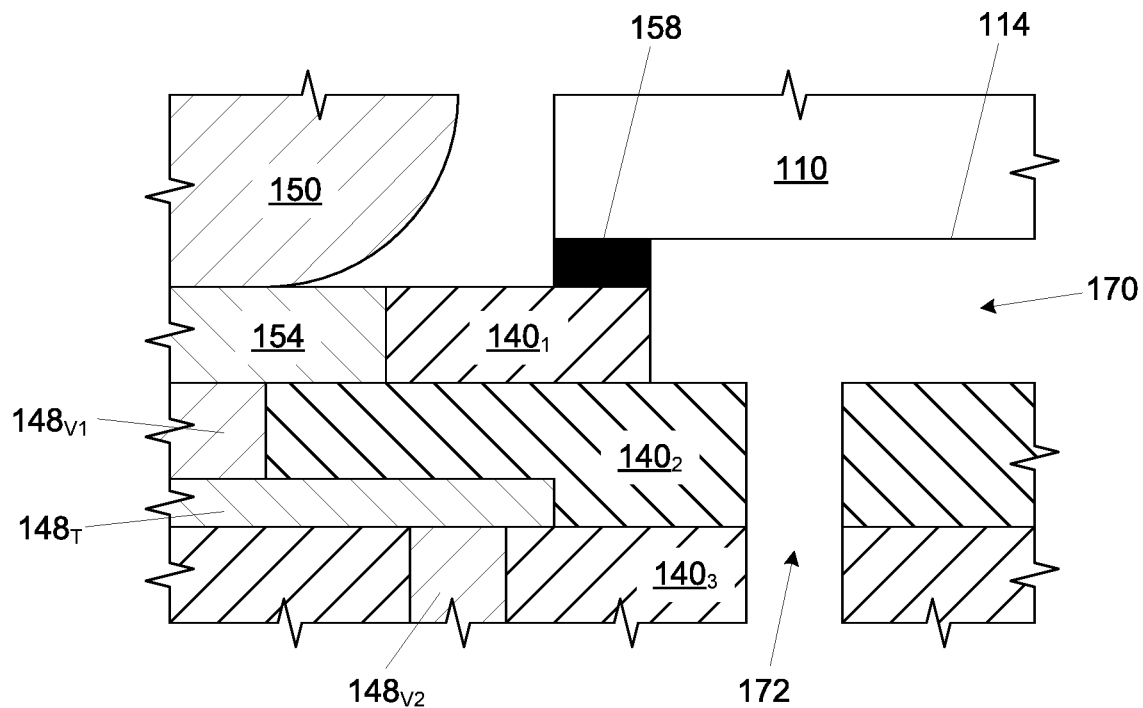
FIG. 12 is a side cross-sectional view of an inset A of FIG. 11, according to another embodiment of the present description.

In another embodiment, when the underfill material 156 of FIGS. 1 and 2 is not needed, it may be replaced with a sealant wall 158 in the contact area C between the second surface 114 of the integrated circuit device 110 and the first surface 142 of the second substrate 140, as shown in FIGS. 11 and 12. In one embodiment, the sealant wall 158 may be a conductive material, including, but not limited to, metal filled epoxies and the like.

Although not specifically illustrated, it is understood that the inlet port 172 and the outlet port 174 may be attached to a heat transfer fluid container (not shown) and the pump (not shown) placed on the second substrate 140 or a device (not shown) where the second substrate 140 is mounted or inserted.

Figure 13:
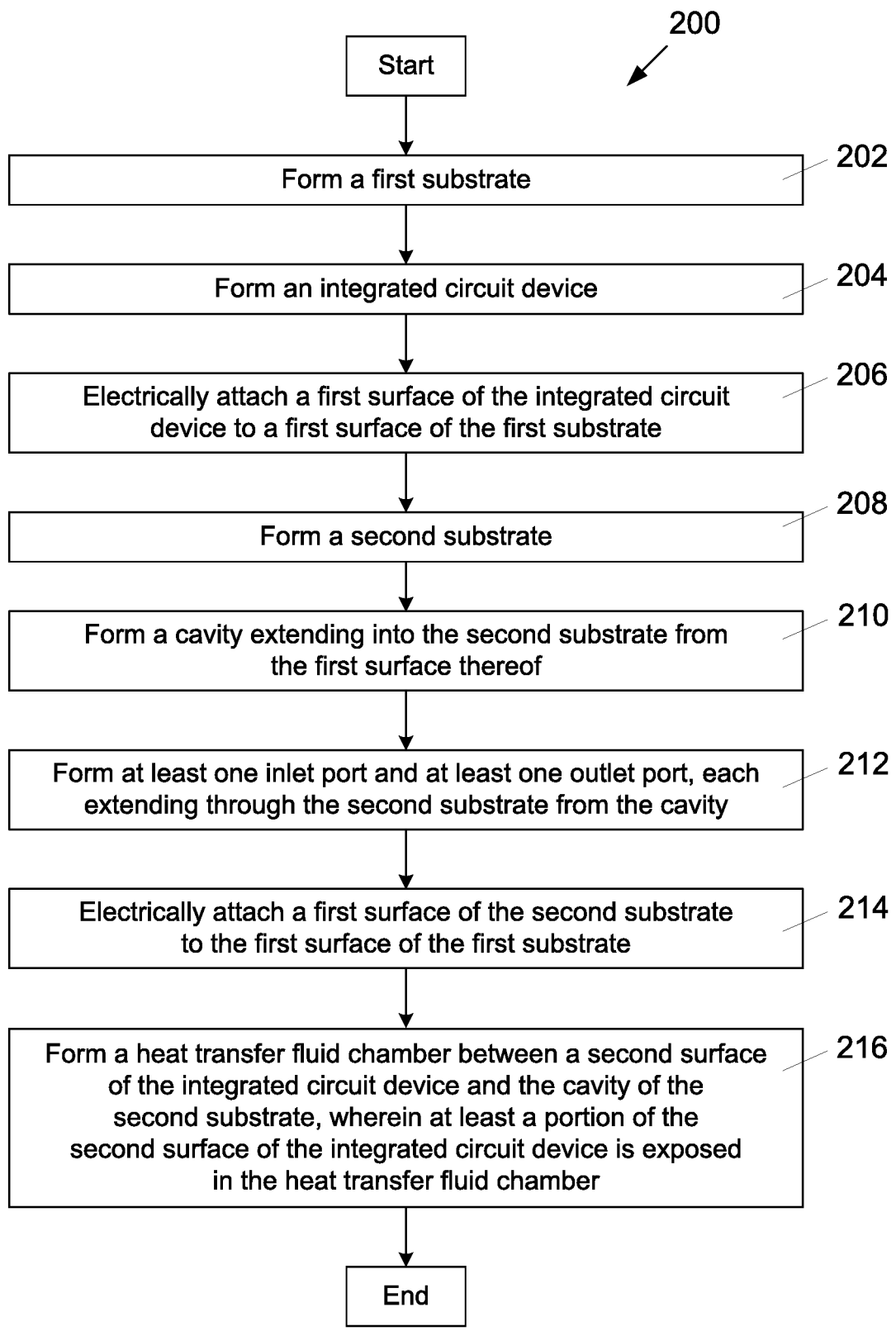
FIG. 13 is a flow diagram of a method of fabricating an integrated circuit structure, according to one embodiment of the present description.

FIG. 13 is a flow chart of a process 200 of fabricating an integrated circuit assembly according to an embodiment of the present description. As set forth in block 202, a first substrate may be formed. An integrated circuit device may be formed, as set forth in block 204. As set forth in block 206, a first surface of the integrated circuit device may be electrically attached to a first surface of the first substrate. A second substrate may be formed, as set forth in block 208. As set forth in block 210, a cavity may be formed extending into the second substrate from the first surface thereof. At least one inlet port and at least one outlet port, each extending through the second substrate from the cavity, as set forth in block 212. As set forth in block 214, the first surface of the second substrate may be electrically attached to the first surface of the first substrate. A heat transfer fluid chamber may be formed between a second surface of the integrated circuit device and the cavity of the second substrate, wherein the at least a portion of the second surface of the integrated circuit device is exposed in the heat transfer fluid chamber, as set forth in block 216.

Figure 14:
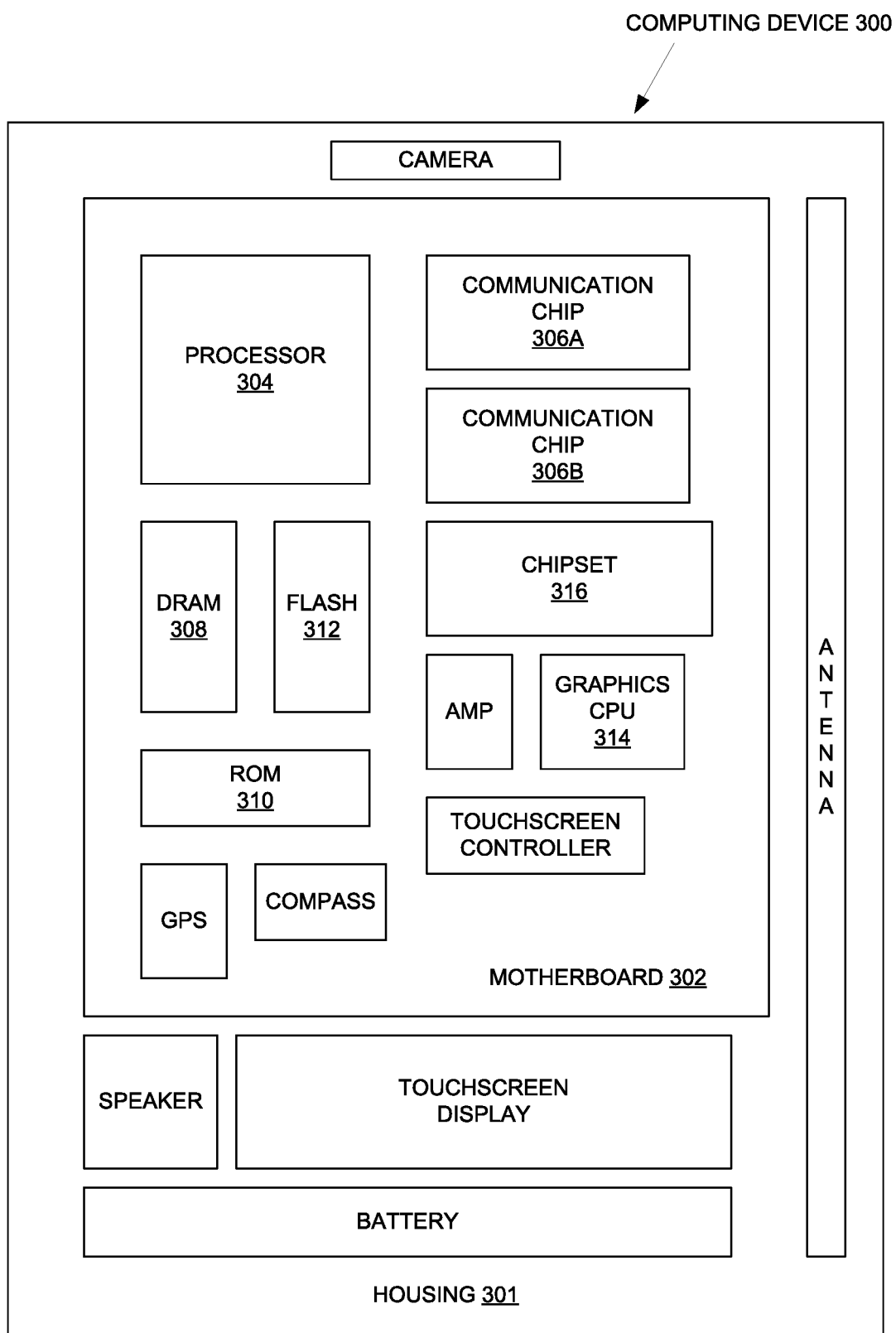
FIG. 14 is a schematic of an electronic device/system, according to an embodiment of the present description.

FIG. 14 illustrates an electronic or computing device 300 in accordance with one implementation of the present description. The computing device 300 may include a housing 301 having a board 302 disposed therein. The board 302 may include a number of integrated circuit components, including but not limited to a processor 304, at least one communication chip 306A, 306B, volatile memory 308 (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 302. In some implementations, at least one of the integrated circuit components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit assembly comprising a substrate, a first integrated circuit device electrically attached to the substrate, a second integrated circuit device electrically attached to the first integrated circuit device, and a heat dissipation device defining a fluid chamber, wherein at least a portion of the first integrated circuit device and at least a portion of the second integrated circuit device are exposed to the fluid chamber. The integrated circuit assembly may further include at least one channel formed in an underfill material between the first integrated circuit device and the second integrated circuit device, between the first integrated circuit device and the substrate, and/or between the second integrated circuit device and the substrate, wherein the at least one channel is open to the fluid chamber.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-14. The subject matter may be applied to other integrated circuit devices and assembly applications, as well as any appropriate electronic application, as will be understood to those skilled in the art.

The follow examples pertain to further embodiments and specifics in the examples may be used anywhere in one or more embodiments, wherein Example 1 is an integrated circuit assembly, comprising a first substrate; an integrated circuit device having a first surface electrically attached to a first surface of the first substrate; a second substrate, wherein a first surface of the second substrate is electrically attached to the first surface of the first substrate and wherein the second substrate includes a cavity extending into the second substrate from the first surface thereof; a heat transfer fluid chamber between a second surface of the integrated circuit device and the cavity of the second substrate, wherein at least a portion of a second surface of the integrated circuit device is exposed to the heat transfer fluid chamber; at least one inlet port extending through the second substrate, wherein the at least one inlet port extends from the second surface of the second substrate to the heat transfer fluid chamber; and at least one outlet port extending through the second substrate, wherein the at least one outlet port extends from the heat transfer fluid chamber to the second surface of the second substrate.

In Example 2, the subject matter of Example 1 can optionally include an underfill material disposed between the first surface of the first substrate and the first surface of the second substrate.

In Example 3, the subject matter of either of Examples 1 or 2 can optionally include the underfill material disposed between the first surface of the first substrate and the first surface of the integrated circuit device.

In Example 4, the subject matter of Example 1 can optionally include a sealant material between the first surface of the second substrate and the second surface of the integrated circuit device.

In Example 5, the subject matter of any of Examples 1 to 4 can optionally include an additional integrated circuit device electrically attached to a second surface of the first substrate.

In Example 6, the subject matter of Example 5 can optionally include the additional integrated circuit device being electrically connected to the integrated circuit device through the first substrate.

In Example 7, the subject matter of any of Examples 1 to 6 can optionally include the integrated circuit device comprising a radio frequency device and the additional integrated circuit device comprising an antenna.

In Example 8, an electronic system may comprise a housing, a board within the housing, wherein the board includes a cavity extending into the board form a first surface thereof; an integrated circuit package electrically attached to the board, wherein the integrated circuit package comprises an integrated circuit device having a first surface electrically attached to a first surface of an interposer and wherein the first surface of the interposer is electrically attached to the first surface of the board; a second substrate, wherein a first surface of the second substrate is electrically attached to the first surface of the first substrate and wherein the second substrate includes a cavity extending into the second substrate from the first surface thereof; a heat transfer fluid chamber between a second surface of the integrated circuit device and the cavity of the second substrate, wherein at least a portion of a second surface of the integrated circuit device is exposed to the heat transfer fluid chamber; at least one inlet port extending through the second substrate, wherein the at least one inlet port extends from the second surface of the second substrate to the heat transfer fluid chamber; and at least one outlet port extending through the second substrate, wherein the at least one outlet port extends from the heat transfer fluid chamber to the second surface of the second substrate.

In Example 9, the subject matter of Example 8 can optionally include an underfill material disposed between the first surface of the interposer and the first surface of the board.

In Example 10, the subject matter of either of Examples 8 or 9 can optionally include the underfill material disposed between the first surface of the interposer and the first surface of the integrated circuit device.

In Example 11, the subject matter of Example 8 can optionally include a sealant material between the first surface of the board and the second surface of the integrated circuit device.

In Example 12, the subject matter of any of Examples 8 to 11 can optionally include an additional integrated circuit device electrically attached to a second surface of the interposer.

In Example 13, the subject matter of Example 12 can optionally include the additional integrated circuit device being electrically connected to the integrated circuit device through the interposer.

In Example 14, the subject matter of any of Examples 8 to 13 can optionally include the integrated circuit device comprising a radio frequency device and the additional integrated circuit device comprising an antenna.

In Example 15, a method of fabricating an integrated circuit assembly, comprising forming a first substrate; forming an integrated circuit device; electrically attaching a first surface of the integrated circuit device to a first surface of the first substrate; forming a second substrate; forming a cavity extending into the second substrate from the first surface thereof forming at least one inlet port and an outlet port, each extending through the second substrate from the cavity; electrically attaching the first surface of the second substrate to the first surface of the first substrate; and forming a heat transfer fluid chamber between a second surface of the integrated circuit device and the cavity of the second substrate, wherein at least a portion of the second surface of the integrated circuit device is exposed in the heat transfer fluid chamber.

In Example 16, the subject matter of Example 15 can optionally include disposing an underfill material between the first surface of the first substrate and the first surface of the second substrate.

In Example 17, the subject matter of either of Examples 15 or 16 can optionally include disposing the underfill material between the first surface of the first substrate and the first surface of the integrated circuit device.

In Example 18, the subject matter of Example 15 can optionally include forming a sealant material between the first surface of the second substrate and the second surface of the integrated circuit device.

In Example 19, the subject matter of any of Examples 15 to 18 can optionally include electrically attaching an additional integrated circuit device to a second surface of the first substrate.

In Example 20, the subject matter of Example 19 can optionally include the additional integrated circuit device being electrically connected to the integrated circuit device through the first substrate.

In Example 21, the subject matter of any of Examples 15 to 20 can optionally include the integrated circuit device comprising a radio frequency device and the additional integrated circuit device comprising an antenna.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An integrated circuit assembly, comprising:
   a first substrate;
   an integrated circuit device having a first surface electrically attached to a first surface of the first substrate, wherein the integrated circuit device comprises a radio frequency device;
   an additional integrated circuit device electrically attached to a second surface of the first substrate, wherein the additional integrated circuit device is electrically attached to the integrated circuit device through the first substrate, and wherein the additional integrated circuit device comprises an antenna;
   a second substrate, wherein a first surface of the second substrate is electrically attached to the first surface of the first substrate and wherein the second substrate includes a cavity extending into the second substrate from the first surface thereof;
   a heat transfer fluid chamber between a second surface of the integrated circuit device and the cavity of the second substrate, wherein at least a portion of a second surface of the integrated circuit device is exposed to the heat transfer fluid chamber;
   at least one inlet port extending through the second substrate, wherein the at least one inlet port extends from the second surface of the second substrate to the heat transfer fluid chamber; and
   at least one outlet port extending through the second substrate, wherein the at least one outlet port extends from the heat transfer fluid chamber to the second surface of the second substrate.

2. The integrated circuit assembly of claim 1, further comprising an underfill material disposed between the first surface of the first substrate and the first surface of the second substrate.

3. The integrated circuit assembly of claim 2, wherein the underfill material is further between the first surface of the first substrate and the first surface of the integrated circuit device.

4. The integrated circuit assembly of claim 1, further comprising a sealant material between the first surface of the second substrate and a second surface of the integrated circuit device.

5. An electronic system, comprising:
a housing;
a board within the housing, wherein the board includes a cavity extending into the board from a first surface thereof;
an integrated circuit package electrically attached to the board, wherein the integrated circuit package comprises an integrated circuit device having a first surface electrically attached to a first surface of an interposer and an additional integrated circuit device electrically attached to a second surface of the interposer, wherein the additional integrated circuit device is electrically attached to the integrated circuit device through the interposer, wherein the integrated circuit device comprises a radio frequency device, wherein the additional integrated circuit device comprises an antenna, and wherein the first surface of the interposer is electrically attached to the first surface of the board;
a heat transfer fluid chamber between a second surface of the integrated circuit device and the cavity of the board, wherein at least a portion of a second surface of the integrated circuit device is exposed to the heat transfer fluid chamber;
at least one inlet port extending through the board, wherein the at least one inlet port extends from the second surface of the board to the heat transfer fluid chamber; and
at least one outlet port extending through the board, wherein the at least one outlet port extends from the heat transfer fluid chamber to the second surface of the board.

6. The electronic system of claim 5, further comprising an underfill material disposed between the first surface of the interposer and the first surface of the board.

7. The electronic system of claim 6, wherein the underfill material is further between the first surface of the interposer and the first surface of the integrated circuit device.

8. The electronic system of claim 5, further comprising a sealant material between the first surface of the board and a second surface of the integrated circuit device.

9. A method of fabrication of an integrated circuit assembly, comprising:
forming a first substrate;
forming an integrated circuit device, wherein the integrated circuit device comprises a radio frequency device;
electrically attaching a first surface of the integrated circuit device to a first surface of the first substrate;
forming an additional integrated circuit device, wherein the additional integrated circuit device comprises an antenna;
electrically attaching an additional integrated circuit device to a second surface of the first substrate, wherein the additional integrated circuit device is electrically connected to the integrated circuit device through the first substrate;
forming a second substrate;
forming a cavity extending into the second substrate from the first surface thereof;
forming at least one inlet port and at least one outlet port, each extending through the second substrate from the cavity;
electrically attaching a first surface of the second substrate to the first surface of the first substrate; and
forming a heat transfer fluid chamber between a second surface of the integrated circuit device and the cavity of the second substrate, wherein at least a portion of the second surface of the integrated circuit device is exposed to the heat transfer fluid chamber.

10. The method of claim 9, further comprising disposing an underfill material between the first surface of the first substrate and the first surface of the second substrate.

11. The method of claim 10, further comprising disposing the underfill material between the first surface of the first substrate and the first surface of the integrated circuit device.

12. The method of claim 9, further comprising forming a sealant material between the first surface of the second substrate and a second surface of the integrated circuit device.

13. An electronic system, comprising:
a housing;
a board within the housing, wherein the board includes a cavity extending into the board from a first surface thereof;
an integrated circuit package electrically attached to the board, wherein the integrated circuit package comprises an integrated circuit device having a first surface electrically attached to a first surface of an interposer and wherein the first surface of the interposer is electrically attached to the first surface of the board;
a sealant material between the first surface of the board and a second surface of the integrated circuit device;
a heat transfer fluid chamber between a second surface of the integrated circuit device and the cavity of the board, wherein at least a portion of a second surface of the integrated circuit device is exposed to the heat transfer fluid chamber;
at least one inlet port extending through the board, wherein the at least one inlet port extends from the second surface of the board to the heat transfer fluid chamber; and
at least one outlet port extending through the board, wherein the at least one outlet port extends from the heat transfer fluid chamber to the second surface of the board.

14. The electronic system of claim 13, further comprising an underfill material disposed between the first surface of the interposer and the first surface of the board.

15. The electronic system of claim 14, wherein the underfill material is further between the first surface of the interposer and the first surface of the integrated circuit device.

16. A method of fabrication of an integrated circuit assembly, comprising:
forming a first substrate;
forming an integrated circuit device;
electrically attaching a first surface of the integrated circuit device to a first surface of the first substrate;
forming a second substrate;
forming a cavity extending into the second substrate from the first surface thereof;
forming at least one inlet port and at least one outlet port, each extending through the second substrate from the cavity;
electrically attaching a first surface of the second substrate to the first surface of the first substrate;
forming a sealant material between the first surface of the second substrate and a second surface of the integrated circuit device; and
forming a heat transfer fluid chamber between a second surface of the integrated circuit device and the cavity of the second substrate, wherein at least a portion of the second surface of the integrated circuit device is exposed in the heat transfer fluid chamber.

17. The method of claim 16, further comprising disposing an underfill material between the first surface of the first substrate and the first surface of the second substrate.

18. The method of claim 17, further comprising disposing the underfill material between the first surface of the first substrate and the first surface of the integrated circuit device.

\* \* \* \* \*